United States Statutory Invention Registration [19]

[11] Reg. Number: H390

Lee et al. [43] Published: Dec. 1, 1987

[54] SELF-ALIGNED GATE MESFET AND THE METHOD OF FABRICATING SAME

[75] Inventors: Robert E. Lee, Thousand Oaks; Harold M. Levy, Los Angeles, both of Calif.

[73] Assignee: The United States of America as represented by the Secretary of the Air Force, Washington, D.C.

[21] Appl. No.: 869,854

[22] Filed: May 28, 1986

Related U.S. Application Data

[63] Continuation of Ser. No. 505,148, Jun. 17, 1983.

[51] Int. Cl.[4] ..... H01L 29/80; H01L 29/36; H01L 29/48

[52] U.S. Cl. ..... 357/22; 357/15; 357/47; 357/88; 148/DIG. 88; 437/22

[58] Field of Search ..... 357/22, 15, 47, 88; 148/DIG. 88

[56] References Cited

U.S. PATENT DOCUMENTS

| | | | |
|---|---|---|---|
| 4,222,164 | 9/1980 | Triebwasser | 357/22 |
| 4,377,030 | 3/1983 | Pettenpaul et al. | 357/22 |
| 4,389,768 | 6/1983 | Fowler et al. | 357/22 I |
| 4,396,437 | 8/1983 | Kwok et al. | 357/22 |
| 4,426,656 | 1/1984 | DiLorenzo et al. | 357/22 |
| 4,426,767 | 1/1984 | Swanson et al. | 357/22 |
| 4,455,738 | 6/1984 | Houston et al. | 357/22 |

OTHER PUBLICATIONS

Fukuta et al, "4-GHz 15-W Power GaAs MESFET", pp. 559-563, *IEEE Trans. on Elec. Devices* vol. Ed-25, No. 6, Jun. 1978.

"Ti/W Silicide . . . VLSIS", Yokoyama et al, IEDM proceeding, pp. 80-83, 1981.

*Primary Examiner*—Stephen C. Buczinski
*Assistant Examiner*—Linda J. Wallace
*Attorney, Agent, or Firm*—Bernard E. Franz; Donald J. Singer

[57] ABSTRACT

An improved performance MESFET device incorporating a structure fabricated utilized self-aligned gate process technology. The edges of the gate electrode formed are separated from the edges of the dopant regions implanted in the device substrate by a distance which optimizes device performance. In order to increase process yield, a layer of dielectric material is deposited on the substrate surface and then annealed to protect the gate electrode and both stabilize and planarize the substrate surface.

8 Claims, 7 Drawing Figures

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

SELF-ALIGNED GATE MESFET AND THE METHOD OF FABRICATING SAME

The Government has rights in this invention pursuant to Contract No. F33615-81-C-1427 awarded by the Department of the Air Force.

This application is a continuation of application Ser. No. 505,148, filed June 17, 1983.

BACKGROUND OF THE INVENTION

1. Field of the Invention

The invention relates to an improved method for fabricating metal semiconductor field effect transistor (MESFET) devices, and, in particular, a method for fabricating a self-aligned gate MESFET wherein the separation between the gate electrode and the dopant self-aligned contact is controlled to optimize the parasitic source resistance to gate capacitance ratio thus improving device performance.

2. Description of the Prior Art

Factors which have limited the performance and yields obtainable in conventional FET processing techniques are the need to perform either (1) a precise recess etch to reduce the FET pinch-off voltage, or (2) a critical realignment of the gate electrode to an existing active channel region to reduce source resistance. A prior art technique solution to these problems is disclosed in the articles "A Self-Aligned Source/Drain Planar Device for Ultrahigh-Speed GaAs MESFET VLSIs" by N. Yokoyama, et al., ISSCC Digest of Technical Papers, pp. 218–219 (February 1981), and "Ti/W Silicide Gate Technology for Self-Aligned GaAs MESFET VLSI's" by Yokoyama, et al., International Electron Device Meeting Proceeding, pp. 80 (1981). In particular, a fabrication process is described wherein an active channel layer is formed on a semi-insulating substrate and a refractory metal gate is used as a self-aligned mask for an implant which established the n+ contact regions. In this instance, the MESFET Pinch off voltage is controlled by the channel implant (no recess etch is required) and the source parasitic resistance is reduced by the self-aligned n+ contact implant.

A critical factor in using self-aligned gate techniques is the proximity of the n+ regions to the gate. A tradeoff exists between parasitic source-gate resistance and parasitic gate capacitance as the proximity of the n+ contact close to the gate lowers the parasitic resistance (as discussed in Yokoyama et al. articles) but raises the gate capacitance and vice versa. Further, the position of the n+ regions with respect to the gate also influences the breakdown voltage of the gate contact to semiconductor Schottky barrier.

The process described in the Yokoyama et al. references approaches the tradeoff problem by varying the depth of the buried n+ implant relative to the channel implant. A problem with this approach is the relatively high resistivity layer between the ohmic contact and the peak of the n+ implant, a problem inherent in the use of a buried implant where a current path to the surface must exist. This reduces device switching speeds, increases power requirements in digital circuits and increases the noise factor while lowering the frequency response when the device is utilized in analog circuits.

SUMMARY OF THE INVENTION

The present invention provides an improved self-faligned gate process for fabricating metal semiconductor field effect transistors MESFETS and integrated circuits In particular, an active channel layer is formed on a semi-insulating semiconductor substrate, preferably GaAs, and a refractory metal layer is deposited on the substrate surface. The gate electrode is fabricated by forming a mask of a predetermined width over the metal layer, the mask comprising a selectively non-etchable material. An undercut etch method is utilized to make the final gate width smaller than the width of the gate mask, the gate mask thereafter being utilized as the mask for the implantation of the dopant into the substrate. The gate mask is then removed and a dielectric layer is deposited over the surface of the substrate and then annealed, thus protecting and planarizing the substrate surface and increasing process yields. Ohmic contacts are formed by etching openings in the insulating layer to allow contact to the n+ implant and device fabrication is completed by both the deposit of a second dielectric layer over the protection dielectric layer and the formation of a metal on the second dielectric layer.

The MESFET devices produced by the process of the present invention provides many advantages over the prior art. The gate formed by the undercut etch allows the spacing between the self-aligned contact and the gate electrode to be selected such that the ratio of parasitic resistance to gate capacitance is optimized thus increasing switching speeds, increasing breakdown voltages and lowering device power consumption in digital circuits while also lowering noise and increasing frequency response when the device is utilized in analog circuits. The resultant physical gate electrode is shorter than those produced by standard liftoff methods thus allowing the size (and capacitance) of the device to be correspondingly reduced. The deposition of the dielectric layer on the substrate surface and the annealing thereof after the dopant implant increases process yields, thus reducing manufacturing costs, by protecting the gate metal electrode and the substrate surface from damage, while also stabilizing the semiconductor surface. The dielectric layer, in addition, planarizes the substrate surface so that subsequent process steps can be accomplished on substantially flat surfaces, increasing the accuracy, repeatability and yields of MESFET fabrication.

The MESFET devices produced by the fabrication process of the present invention have the necessary operating characteristics to be used in the manufacture of high speed digital circuits and in the manufacture of lower noise, higher frequency analog type devices used, such circuits and devices being used, for example, in computer, communication, missile and radar systems.

BRIEF DESCRIPTION OF THE DRAWING

For a better understanding of the invention as well as other advantages and further features thereof, reference is made to the following description which is to be read in conjunction with the accompanying drawing wherein the same reference numerals, it should be noted, identify identical components in each of the figures, and wherein.

DETAILED DESCRIPTION OF THE INVENTION

It should be noted that although the detailed description that follows is related to a GaAs FET structure, specifically GaAs MESFET structures, it will be understood that the invention is suitable for other III–V materials, such as indium phosphide ($I_nP$), used in similar applications and that the techniques described can be applied to other FET structures such as MOSFET structures when insulating layers can be achieved.

Figure 1:
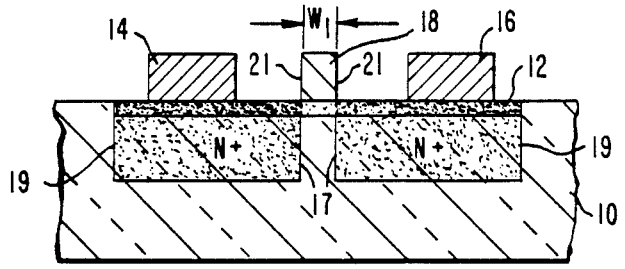
Fig. 1. (PRIOR ART)
FIG. 1 is a cross-sectional view of a GaAs MESFET fabricated in accordance with a prior art self-aligned gate process.

In order to put the present invention in perspective, a conventional prior art GaAs MESFET structure will first be described. FIG. 1 depicts such a prior art structure, as described in the above-mentioned Yokoyama articles, the structure comprising a semiinsulating substrate 10, such as GaAs, typically having a resistivity of about $10^7$ ohm-cm. Substrate 10 has an active layer of material 12 supported thereon, layer 12 being an active semiconductor region having an N-type dopant. Layer 12 provides an active region for conduction and control of carriers. Electrodes 14 and 16 are in direct contact with layer 12 and, in FET devices, serve as source and drain electrodes, respectively. Gate electrode 18, having a width W of 1.5 μm, contacts a portion of layer 12 and is spaced from electrodes 14 and 16.

During the fabrication process, a titanium/tungsten (Ti/W) or tungsten silicide (W/Si) mixture is deposited by dc sputtering and etching is performed with a Freon and oxygen ($CF_4O_2$) gas plasma. The n+ layers 19 are made by self-aligned $Si^+$ implantation using gate 18 as the implantation mask. Fabrication is completed by ohmic metalization with AuGe-Au in accordance with standard techniques. The edges 17 of the n+ regions 19 formed by the above described process are, it is observed, aligned with the edges 21 of gate electrode 18. The disadvantages of this alignment feature is that the relative closeness of the edges 21 relative to regions 19 reduces device performance due to the parasitic capacitance factors inherent with device utilization, and decreases the reverse breakdown of the gate.

Figure 2:
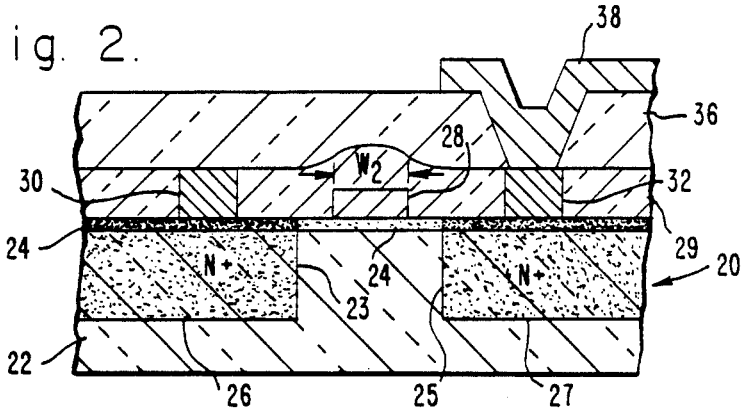
FIG. 2 is a cross-sectional view of one embodiment of a GaAs MESFET fabricated in accordance with the improved self-aligned gate process of the present invention.

In accordance with the present invention, an improved self-aligned gate FET structure is provided. A MESFET device 20 incorporating the structure is shown in FIG. 2. It should be noted that although the device shown in FIG. 2 and fabricated in accordance with the steps shown in FIGS. 3–7 describe an enhancement mode (ENFET) type device, otner type devices, including a depletion mode (DFET) device, can be fabricated utilizing the techniques of the present invention.

Device 20 comprises a GaAs substrate 22 having n+ source and drain regions 26 and 27. An active channel 24 is formed at the upper surface of GaAs substrate 22 and a gate electrode 28 of width $W_2$ is in contact with the surface of substrate 22. A silicon nitride layer 29 overlies the surface of substrate 22 and conductive ohmic metal contacts 30 and 32 make contact to source and drain regions 26 and 27, respectively, through holes etched in dielectric layer 29. The edges 23 and 25 of n+ regions 26 and 27, respectively, it can be seen, are not aligned with the edges of gate 28. In particular, the width of gate 28 is such that it is less than the separation between edges 23 and 25 of n+ regions 26 and 27, respectively. For comparison purposes, the aformentioned separation between gate 28 and edge 25 is about 0.4 μm, the typical width $W_2$ of gate electrodes 28 being on the order of 0.85 μm. The advantages of having a separation between the gate electrode edges and n+ region edges 23 and 25 have been set forth previously, and will be described in more detail hereinafter. The MESFET 20 is completed by depositing an interconnection crossover dielectric layer 36, typically silicon oxynitride, on layer 29 and then etching holes into dielectric layer 36 to allow a top metal (typically chromium, platinum and gold) to form a second level of metal interconnect 38.

Figure 3:
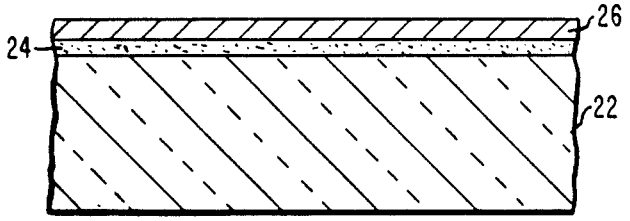
FIGS. 3–7 are cross-sectional views which illustrate the method of fabricating the MESFET of FIG. 2.

Referring now to FIG. 3, in order to fabricate MESFET 20 by the present invention, one starts with a substrate or body 22 of semi-insulating GaAs. It is noted that other materials can be used for substrate 22, including other III∝V materials, such as InP, and mixed III–V semiconductor material such as undoped $Al_xGa_{1-x}As$ (gallium aluminum arsenide). An active layer or channel 24 is formed on the surface of substrate 22 by introducing a layer of n type dopants by ion implantation techniques. In the preferred embodiment, silicon ions are implanted at an energy of about 100 KeV to a dosage in the range from about $1\times10^{12}$ ions/cm$^2$ to about $4\times10^{12}$ ions/cm$^2$. The thickness of the active layer typically is in the range from about 500 Å to about 2000 Å. Other processes which can be used to form the active channel 24 include liquid phase epitaxy, vapor phase epitaxy metal-organic chemical vapor deposition of and molecular beam epitaxy. Ion implantation techniques are preferred for the remaining process steps. Other n-type dopants which could be utilized to form active channel 24 include, for example, selenium, sulphur or tellerium, implanted at energies and dosages which depend on the substrate material and quality and the type of MESFET device to be fabricated.

A layer of refractory metal gate material 26 is deposited on the surface of substrate 22 by rf or dc sputter deposition techniques. Layer 26, having a thickness in the range from about 1000 Å to about 5000 Å, preferably comprises a titanium/tungsten alloy. Compositions of 30% titanium and 70% tungsten by weight have been sucessfully utilized. Other materials which can be utilized as the gate layer include, for example, tungsten, tantalum, titaniumtungsten silicide, tungsten silicide, tantalum silicide, or molybdenum silicide.

Figure 4:
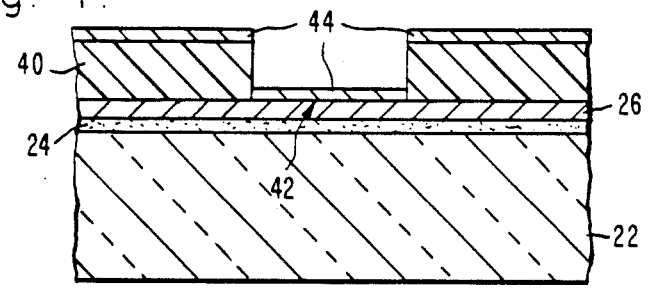

Referring now to FIG. 4, a photoresist layer 40 is next applied to the surface of layer 26. The photoresist layer 40 is defined using conventional photolithography processes and developed to provide a mask which exposes area 42 of metal film 26 which, as will be set forth hereinafter, defines the edges of the implanted dopant of the MESFET device being fabricated. A layer of etch resistant metal 44, such as nickel or aluminum, is formed over photoresist 40 and area 42 by evaporation deposition techniques. The process is carried out for a time sufficient to grow the layer 44 to a thickness in the range from about 1000 Å to about 2000 Å.

Figure 5:
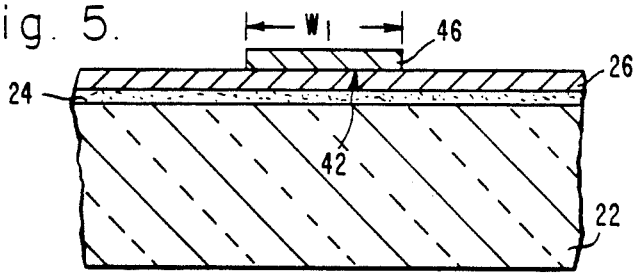

Then, the photoresist layer 40 is dissolved using conventional techniques, a layer 46 of etch resistant metal having a width corresponding to the area 42 remaining as shown in FIG. 5.

Figure 6:
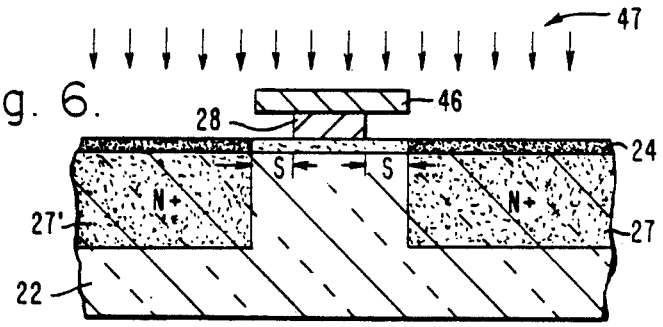

Referring now to FIG. 6, the substrate 22 is placed in a plasma reactor with Freon and oxygen ($CF_4+O_2$) in order to etch the unmasked portions of layer 26. It should be noted that although a plasma etch is preferred, wet chemical or vapor etching can also be utilized. The etch rate can be controlled in a manner to encourage undercut etching, i.e., etching beneath the unmasked layer 26. Further, the etching process is such that the mask layer 46 is slightly undercut symmetrically in stages at a substantially uniform rate. It has been found that a value of the undercut, S, in the range from about 500 Å to about 2500 Å provides the optimum performance results for MESFET 20, a value of S in the range from 1000 Å to about 2000 Å having been determined to provide the best performance results. After the etching process, the width of gate electrode 28 for an undercut of 2000 Å (4000 Å total) is approximately 0.85 μm.

Mask undercutting can be controlled by ascertaining the etch rate time for the non-mask area of layer 26 and then using that rate to control the undercut rate. This can be accomplished directly by process operator or automatically.

For the plurality of MESFET's being fabricated on a wafer, only one value of S need be selected to optimize the performance for that type of MESFET although S can have a standard deviation in the range from about 400 Å to about 500 Å. If S is selected to be 2000 Å, for example, the deviation in S from MESFET to MESFET will not be sufficient to reduce the overall performance improvement in each MESFET fabricated.

Then substrate 22 is flood exposed to silicon ions (represented by the arrows 47) in order to form the heavily doped regions (n+ in the example illustrated) 27' and 27 corresponding to the source and drain regions, respectively. The silicon donor impurities are introduced by ion implantation of silicon ions at an energy of about 125 KeV to a dosage of about $2\times10^{13}$ ions/cm$^2$. The remaining metal layer 46 is then removed by an appropriate chemical selective solvent. Regions 27' and 27 have a thickness in the range from about 500 Å to about 3000 Å.

Figure 7:
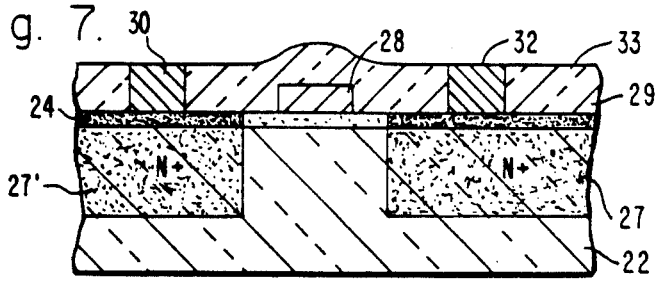

Referring now to FIG. 7, substrate 22 is placed into a plasma enhanced vapor deposition reactor and a silicon nitride ($Si_3N_4$) protective layer 29 is deposited over the surface of substrate 22. Other known deposition reactions, such as the thermal reaction of silane ($SiH_4$) and ammonia ($NH_3$) may be employed. The process is carried out for a time sufficent to form the layer 29 to a thickness in the range from about 1000 Å to about 2000 Å. The substrate is then annealed at approximately 800° F. for approximately 10 minutes. The annealing step minimizes the damage caused to the substrate crystal structure after ion implantation (n+ in the example described) at high energy levels. Other dielectrics which can be utilized include $SiO_2$ and $Al_2O_3$.

Then, an anisotropic plasma etch, using either $C_2F_6$, $C_3F_8$ or $CHF_3$, removes portions of the $Si_3N_4$, and forms holes to provide for ohmic contact definition. The holes are filled with ohmic contact material 30 and 32, typically a composition of gold and germanium, to allow for connection to the underlying source and drain semiconductor regions. The substrate is then heated to 360° F. in order to improve the contact between material 30 and 32 and the adjacent n+ regions 27. The surface 33 of layer 39 is substantially planar except for the relatively small "bump" area adjacent to electrode 28. A hole is etched (not shown) in layer 29 to enable a metal connect to gate electrode 28.

Although not shown in the figure since it is not part of the MESFET device 20 finally fabricated, each device on the wafer is isolated from the adjacent device to prevent electron leakage. In particular, a photoresist layer is deposited on the dielectric layer 20 to mask the conducting regions and boron ions are implanted around the sides of each device at an energy of about 80 KeV to a dosage of about $1\times10^{13}$ ions/cm$^2$. After the implant, the photoresist mask is chemically removed.

Finally, using conventional procedures, a second dielectric layer 36 (FIG. 2) may be deposited over layer 29 to allow for crossover connections and metal layer 38, typically chromium, platinum, and gold, is deposited over layer 36, the metal layer 38 being defined and etched using conventional photolithographic processes, well known in the art, to complete the device 20 shown in FIG. 2.

EXAMPLE

Devices substantially depicted in FIG. 2 have been fabricated in accordance with the process steps described hereinabove with reference to FIGS. 3–7. Typical devices have an active region (n-type) doped with Si to $10^{12}$ ions/cm$^2$. The thickness of the active region varied from 500 Å to about 2000 Å, the dopant regions varied in thickness from about 500 Å to about 3000 Å, the undercut value S for the electrode gate varied from about 1000 Å to about 2000 Å, and the silicon nitride protective layer varied in thickness from about 1000 Å to about 2000 Å.

The measured electrical properties of two ENFET devices fabricated in accordance with the teachings of the present invention were as follows (both devices 28 μm wide, threshold voltage 0.2 volts): For a 1.1 μm gate width, the drain-source current $I_{DS}=17.8$ ma/mm; the transconductance, gm=90 mS/mm; gate voltage $V_G=0.6$ volts; drain-source voltage $V_{DS}=1$ volt. For a 0.8 μm gate width, $I_{DS}=26.8$ ma/mm; gm=140 mS/mm at $V_G=0.6$ volts and $V_{DS}=1$ volt.

The self-aligned gate process described hereinabove thus provides significant advantages over prior art MESFET processes by increasing both device performance and process yields. Performance is significantly increased by providing a technique for optimizing the parasitic source resistance and parasitic gate capacitance ratio which normally limits device performance. The measure of the speed capability of MESFETs, $f_t$, is given by a $g_m'/2\pi C_g$ wherein $$g_m' = \frac{g_m}{1 + R_s g_m},$$

$g_m'$ and $g_m$ being the terminal and intrinsic transconductance respectively, $R_s$ is the parasitic source resistance and $C_g$ the total gate capacitance. Optimization is possible because as S is increased from zero, $C_g$ decreases more rapidly than $R_s$ increases, thus establishing that there is an optimum separation S (wider separations produce increased gate breakdown thus allowing higher gate voltages).

Thus, by controlling the separation between the edges of the dopant implant and the edges of the gate electrode in accordance with the teachings of the present invention, MESFET performance is enhanced without significantly increasing the cost of device fabrication. Comparing the switching speed of devices formed in accordance with the teaching of the present invention to devices performing the same function and fabricated with prior art techniques, an ENFET ring-oscillator fabricated in accordance with the invention provided a 25 psec gate delay (for a gate width 0.85 μm) as compared to the 50 psec delay of an oscillator fabricated by the prior art process described hereinabove (gate width 1.1 μm). The power dissipation was also significantly reduced from 6.5 mw/gate (at $V_D=5$ volts) to 3.3 mw/gate (at $V_D=2.6$ volts). Additional advantages in utilizing the process of the present invention is that the gate electrode width will always be smaller than the gate mask width, thus enabling device size to be further reduced from that available in the prior art. The dielectric layer enables process yields to increase by stabilizing and passivating the substrate surface (prevents the arsenic component of the substrate from escaping during the annealing step following dopant implantation and also protects the substrate surface from exposure to the environment); protecting the gate electrode; and planarizing the substrate surface to allow subsequent processing steps to be accurately accomplished.

While the invention has been described with reference to its preferred embodiments, it will be understood by those skilled in the art that various changes may be made and equivalents may be substituted for elements thereof without departing from the true nature and scope of the invention. In addition, many modifications may be made to adapt a particular situation or material to the teachings of the present invention without departing from its essential teachings.

What is claimed is:

1. A MESFET device comprising:

a substrate of semi-insulating III–V semiconductor material;

a doped active channel layer of III–V semiconductor material containing impurities of a selected conductivity type formed in a surface portion of said substrate;

first and second doped regions containing a heavier concentration of impurities of said selected conductivity type formed in said substrate at respective locations adjacent opposite ends of said channel layer;

a gate electrode contacting at least a portion of said active channel layer and positioned on said substrate surface between said first and second doped regions, the edges of said gate electrode being spaced from the respective edges of said first and second doped regions by a distance of from about 1000 Å to about 2000 Å, whereby a selected optimal ratio of parasitic source resistance to parasitic gate capacitance is achieved, a layer of dielectric material formed on the surface of said substrate and overlying said gate electrode and said first and second doped regions; and first and second ohmic contacts extending through said dielectric layer and electrically contacting said first and second doped regions.

2. The structure of claim 1 wherein said semiconductor substrate is of gallium arsenide.

3. The structure of claim 1 wherein said semiconductor substrate is of indium phosphide.

4. A MESFET device comprising:

a substrate of semi-insulating III–V semiconductor material;

a doped active channel layer of III–V semiconductor material containing impurities of a selected conductivity type formed in a surface portion of said substrate, said active channel layer being on the order of about 500 Å to 2000 Å in thickness;

first and second doped regions containing a heavier concentration of impurities of said selected conductivity type formed in said substrate at respective locations adjacent opposite ends of said channel layer;

a gate electrode contacting a portion of said active channel layer and positioned on said substance surface between said first and second doped regions, the edges of said gate electrode being spaced from the respective edges of said first and second doped regions by a distance of from about 1000 Å to about 2000 Å, whereby a selected optimal ratio of parasitic source resistance to parasitic gate capacitance is achieved;

a layer of dielectric material formed on the surface of said substrate and overlying said gate electrode and said first and second doped regions, said dielectric layer being in the range from about 1000 Å to about 2000 Å in thickness;

first and second ohmic contacts extending through said dielectric layer and electrically contacting said first and second doped regions.

5. The structure of claim 4 wherein said semiconductor substrate is of gallium arsenide.

6. The structure of claim 4 wherein said semiconductor substrate is of indium phosphide.

7. A MESFET device comprising:

a semi-insulating gallium arsenide semiconductor substrate;

a doped active channel layer of III–V semiconductor material containing impurities of a selected conductivity type formed on a surface portion of said substrate, said active channel layer being in the order of about 500 Å to 2000 Å in thickness;

first and second doped regions containing a heavier concentration of impurities of said selected conductivity type formed in said substrate at respective locations adjacent opposite ends of said channel layer, said doped regions comprising silicon ions and being in the range of from about 500 Å to 3000 Å in thickness;

a gate electrode contacting at least a portion of said active channel layer and positioned on said substrate surface between said first and second doped regions, the edges of said gate electrode being spaced from the respective edges of said first and second doped regions by a distance of from about 1000 Å to about 2000 Å, whereby a selected optimal ratio of the parasitic source resistance to parasitic gate capacitance is achieved;

a layer of silicon nitrate formed on the surface of said substrate and overlying said gate electrode and said first and second doped regions, said silicon nitrate layer being in the range of from about 1000 Å to about 2000 Å in thickness;

first and second ohmic contacts extending through said dielectric layer and electrically contacting said first and second doped regions.

8. The structure of claim 7 wherein the thickness of said gate electrode is in the range of from about 2000 Å to about 5000 Å.

* * * * *